United States Patent
Shi et al.

(10) Patent No.: US 10,553,737 B2
(45) Date of Patent: Feb. 4, 2020

(54) PHOTOVOLTAIC ASSEMBLY

(71) Applicant: Sunman (Hong Kong) Limited, Hong Kong (CN)

(72) Inventors: Zhengrong Shi, Shanghai (CN); Guozhu Long, Shanghai (CN); Jiaoyan Liu, Shanghai (CN); Chengrong Lian, Shanghai (CN); Weili Wang, Shanghai (CN)

(73) Assignee: SUNMAN (HONG KONG) LIMITED, HongKong (CN)

( * ) Notice: Subject to any disclaimer, the term of this patent is extended or adjusted under 35 U.S.C. 154(b) by 0 days.

(21) Appl. No.: 16/394,004

(22) Filed: Apr. 25, 2019

(65) Prior Publication Data

US 2019/0252563 A1    Aug. 15, 2019

Related U.S. Application Data

(63) Continuation-in-part of application No. PCT/CN2016/112546, filed on Dec. 28, 2016.

(30) Foreign Application Priority Data

Oct. 31, 2016 (CN) .......................... 2016 1 0927464

(51) Int. Cl.
    *H01L 31/048* (2014.01)
    *B32B 37/22* (2006.01)
    (Continued)

(52) U.S. Cl.
    CPC ........ *H01L 31/0481* (2013.01); *B32B 37/226* (2013.01); *C09D 5/03* (2013.01);
    (Continued)

(58) Field of Classification Search
    CPC .............. H01L 31/0481; H01L 31/186; H01L 31/1864; H01L 31/1876; H01L 21/56;
    (Continued)

(56) References Cited

U.S. PATENT DOCUMENTS 4,315,964 A * 2/1982 Ozaki .................... B29C 70/00
                                                      428/182
5,447,576 A * 9/1995 Willis ............... B32B 17/10678
                                                      136/251
(Continued)

FOREIGN PATENT DOCUMENTS

CN         105637653 A  *  6/2016  .......... H01L 31/048

*Primary Examiner* — Golam Mowla
(74) *Attorney, Agent, or Firm* — Matthias Scholl P.C.; Matthias Scholl (57) ABSTRACT

A laminated structure, including: a first encapsulation layer, a second encapsulation layer, and a solar cell string between the first encapsulation layer and the second encapsulation layer. The first encapsulation layer includes 30-50 wt. % of fiber cloth and 50-70 wt. % of a first powder coating evenly disposed on the fiber cloth. The second encapsulation layer includes 30-50 wt. % of the fiber cloth and 50-70 wt. % of a second powder coating evenly disposed on the fiber cloth. The first powder coating includes an acrylic powder coating or a polyester powder coating. The second powder coating includes the polyester powder coating. The acrylic powder coating includes an acrylic resin and an acrylic resin curing agent. The polyester powder coating includes a polyester resin and a polyester resin curing agent.

20 Claims, 8 Drawing Sheets (51) Int. Cl.
*C09D 133/00* (2006.01)
*C09D 167/00* (2006.01)
*C09D 5/03* (2006.01)

(52) U.S. Cl.
CPC ......... *C09D 133/00* (2013.01); *C09D 167/00* (2013.01); *H01L 31/048* (2013.01); *Y02E 10/50* (2013.01)

(58) Field of Classification Search
CPC .... D06N 3/0006; D06N 3/0093; D06N 3/123; D06M 15/263; B32B 37/226; C09D 5/03; C09D 133/00; C09D 167/00
See application file for complete search history.

(56) References Cited

U.S. PATENT DOCUMENTS

| | | | | |
|---|---|---|---|---|
| 6,093,757 A * | 7/2000 | Pern | ............... | B32B 17/10678 136/251 |
| 6,437,235 B1 * | 8/2002 | Komori | ............... | H02S 20/23 136/244 |
| 7,509,775 B2 * | 3/2009 | Flaherty | ............... | E04D 1/30 52/173.3 |
| 7,531,740 B2 * | 5/2009 | Flaherty | ............... | H02S 20/24 136/244 |
| 8,796,061 B2 * | 8/2014 | Bunea | ............... | H01L 31/048 438/57 |
| 10,434,756 B2 * | 10/2019 | Rummens | ............... | B32B 7/10 |
| 2003/0085383 A1 * | 5/2003 | Burnell-Jones | ............... | C08L 67/06 252/301.36 |
| 2005/0000560 A1 * | 1/2005 | Shiotsuka | ............... | H01L 31/048 136/243 |
| 2011/0168251 A1 * | 7/2011 | Chen | ............... | H01L 31/048 136/256 |
| 2016/0254404 A1 * | 9/2016 | Dries | ............... | H01L 31/048 136/251 |

* cited by examiner

| 21 |
|---|
| 22 |
| 23 |
| 24 |
| 25 |

FIG. 1 (Prior art)

| 11a |
|---|
| 12a |
| 13a |
| 14a |

FIG. 2

| 11b |
|---|
| 12b |
| 13b |
| 14b |
| 15b |

FIG. 3

| 11c |
|---|
| 12c |
| 13c |
| 14c |
| 15c |

FIG. 4

| 11d |
|---|
| 12d |
| 13d |
| 14d |
| 15d |

FIG. 5

| 11e |
|---|
| 12e |
| 13e |
| 14e |
| 15e |
| 16e |

FIG. 6

| 11f |
|---|
| 12f |
| 13f |
| 14f |
| 15f |
| 16f |

FIG. 7

| 11g |
|---|
| 12g |
| 13g |
| 14g |
| 15g |
| 16g |
| 17g |

PHOTOVOLTAIC ASSEMBLY

CROSS-REFERENCE TO RELATED APPLICATIONS

This application is a continuation-in-part of International Patent Application No. PCT/CN2016/112546 with an international filing date of Dec. 28, 2016, designating the United States, now pending, and further claims foreign priority benefits to Chinese Patent Application No. 201610927464.6 filed Oct. 31, 2016. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

This disclosure relates to the field of photovoltaic technology, and more particularly to a laminated structure, a preparation method thereof, as well as a photovoltaic assembly comprising the laminated structure.

Figure 1:
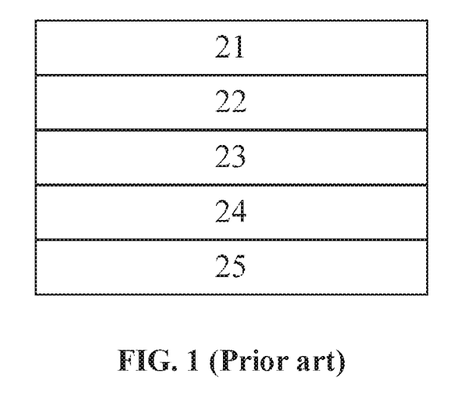
FIG. 1 is a schematic diagram of a laminated structure of a photovoltaic assembly in the related art.

As shown in FIG. 1, a typical laminated structure of photovoltaic assemblies is formed by a super-white tempered embossed glass 21, a first ethylene vinyl acetate (EVA) film 22, a solar cell string 23, a second EVA film 24, and a backplane 25. The photovoltaic assembly formed by the laminated structure is heavy, with an area density of more than 10 kg per square meter. This requires relatively high load-bearing capacity of a building and leads to high installation cost.

SUMMARY

The disclosure provides a laminated structure of photovoltaic assemblies, which is cost-effective, and satisfies the requirements of technical standards of photovoltaic industry such as anti-ultraviolet, anti-aging, anti-impact, fire resistance and anti-insulation. The disclosure realizes the lightweight of the encapsulation materials of photovoltaic assemblies, facilitates installation, and reduces the installation cost.

Another objective of the disclosure is to provide a preparation method of the laminated structure of photovoltaic assemblies. The method can implement the laminating process under low temperature environment, thus reducing the energy consumption, ensuring the high degree of flatness of the laminated structure of photovoltaic assemblies, and facilitating the installation and application of the photovoltaic assemblies.

Disclosed is a laminated structure, comprising: a first encapsulation layer, a second encapsulation layer, and a solar cell string between the first encapsulation layer and the second encapsulation layer. The first encapsulation layer comprises 30-50 wt. % of fiber cloth and 50-70 wt. % of a first powder coating evenly disposed on the fiber cloth; the second encapsulation layer comprises 30-50 wt. % of the fiber cloth and 50-70 wt. % of a second powder coating evenly disposed on the fiber cloth; the first powder coating employs an acrylic powder coating or a polyester powder coating; the second powder coating employs the polyester powder coating; the acrylic powder coating comprises an acrylic resin and an acrylic resin curing agent; the polyester powder coating comprises a polyester resin and a polyester resin curing agent; and the fiber cloth comprises woven fiber material.

The laminated structure can further comprise a fluoroplastic film layer which is disposed on the first encapsulation layer.

The laminated structure can further comprise a packaging film layer. The packaging film layer can be separately disposed between the first encapsulation layer and the solar cell string or between the solar cell string and the second encapsulation layer, or simultaneously disposed between the first encapsulation layer and the solar cell string, and between the solar cell string and the second encapsulation layer. The packaging film layer can be made of EVA, POE or PVB materials. Optionally, technicians in the field can also use other suitable packaging film materials in practice.

EVA refers to Ethylene-Vinyl Acetate copolymer, is made from Ethylene (E) and Vinyl Acetate (VA) by copolymerization; POE refers to Polyolefin Elastomer. PVB refers to Polyvinyl Butyral.

The laminated structure comprises a backplane layer, which is disposed below the second encapsulation layer.

The unit area weight of the first powder coating and the second powder coating applied on the fiber cloth is 70-400 $g/m^2$, and the unit area weight of the fiber cloth is 30-400 $g/m^2$.

The first powder coating and the second powder coating comprises particles that have a size of between 35 and 300 µm and are prepared by premixing, melting, extruding, and milling; a premixing time is 2-10 min; in the extruding process, a length-diameter ratio of an extruder is between 15:1 and 50:1, a heating temperature of the extruder is 80-120° C. a screw speed of the extruder is 200-800 rpm; and a rotation speed of a mill is 50-150 rpm.

The acrylic powder coating comprises 5-25 wt. % of the acrylic resin curing agent; the acrylic resin curing agent is blocked isocyanate, phthalic anhydride, trimellitic anhydride, sebacic acid, undecandioic acid, dodecanedioic acid, tridecanedioic acid, tetradecanedioic acid, pentadecanedioic acid, hexadecanedioic acid, carboxyl polyester, hydrogenated epoxy, GMA acrylic acid or a mixture thereof.

The acrylic powder coating further comprises 5-50 wt % of a first additive; the first additive is polyamide wax, polyolefin wax, amide-modified phenol-urea surfactants, benzoin, polydimethylsiloxane, vinyl trichlorosilane, n-butyl triethoxysilane, methyl orthosilicate, monoalkoxypyrophosphate, acrylic esters, phenolic resin, urea-formaldehyde resin, melamine-formaldehyde resin, diethylene stearate, ethylene oxide and propylene oxide mixture, hindered phenol, thiodipropionate, benzophenone, salicylate derivatives, hindered amines, alumina, gaseous silica, silica, or a mixture thereof.

The polyester powder coating comprises 2-20 wt. % of the polyester resin curing agent; the polyester resin curing agent is triglycidyl isocyanurate, triglycidyl tribenzoate, diglycidyl terephthalate, glycidyl methacrylate, hydroxyalkylamide, isocyanate, or a mixture thereof.

The polyester resin is a hydroxyl polyester resin or carboxyl polyester resin having a glass transition temperature of 50-75° C. and a viscosity of 15-200 Pa·s; a hydroxyl value of the hydroxyl polyester resin is 30-300 mgKOH/g, and an acid value of the carboxyl polyester resin is 15-85 mgKOH/g. The weather resistant polyester resin is formed by monomers such as terephthalic acid, isophthalic acid, neopentyl glycol, adipic acid, ethylene glycol, or a mix there thereof. The synthetic polyester should meet the parameter range, otherwise it does not meet the requirements of the weather resistant polyester resin.

The polyester powder coating further comprises 3-40 wt. % of a second additive; the second additive ispolyamide wax, polyolefin wax, amide-modified phenol urea surfactant, benzoin, polydimethylsiloxane, vinyl trichlorosilane, n-butyl triethoxysilane, methyl orthosilicate, monoalkoxy pyrophosphate, acrylic ester, phenolic resin, urea formaldehyde resin, melamine formaldehyde resin, distearyl ethylenediamine, ethylene oxide and propylene oxide mixture, hindered phenol, dithiopropionate, benzophenone, salicylate derivatives, hindered amine, alumina, gaseous silica, tetrabromobisphenol A, decabromodiphenylethane, trimethylphenyl phosphate, aluminium hydroxide, magnesium hydroxide, barium sulfate, titanium dioxide, carbon black, or a mixture thereof.

The first encapsulation layer or the second encapsulation layer is prepared as follows:
 a) evenly disposing the first powder coating or the second powder coating on the fiber cloth;
 b) thermally bonding the first powder coating or the second powder coating with the fiber cloth, to yield a bonded product; and
 c) sectionally cutting the bonded product obtained in b).

Specifically, thermally bonding the first powder coating or the second powder coating with the fiber cloth is performed under a pressure of 0.05-0.25 megapascal at a temperature of 90-130° C. for 5-20 seconds.

Also provided is a method of preparing the aforesaid laminated structure, the method comprising laminating the first encapsulation layer and the second encapsulation layer at three independent heating stages: a first stage at a temperature of 110-130° C. for 100-600 seconds, a second stage at a temperature of 131-2.00° C. for 100-1200 seconds, and a third stage at a temperature of 25-60° C. under a pressure of 0.05-0.25 megapascal.

The disclosure provides a photovoltaic assembly comprising the aforesaid laminated structure, a coupler, and a junction box, and the laminated structure being electrically connected to the junction box via the coupler.

The coupler comprises a crimp terminal adapted to receive cables, and a heat-shrinkable sleeve which is sheathed on the crimp terminal.

The working principle and advantages of the invention: the first encapsulation layer comprises 30-50 wt. % of fiber cloth and 50-70 wt. % of acrylic powder coating or the polyester powder coating evenly disposed on the fiber cloth; the second encapsulation layer comprises 30-50 wt. % of fiber cloth and 50-70 wt. % of the polyester powder coating evenly disposed on the fiber cloth; when the glass transition temperature and viscosity as well as hydroxyl and acid values of the polyester resin are appropriately controlled, the polyester obtained by crosslinking and curing as the encapsulation material of the surface and back layers can meet the requirements of the technical standards of the photovoltaic industry. Because the cost of the polyester powder coating is much lower than that of the acrylic powder coating, the weight ratio of the powder coating and the fiber cloth is appropriate, and the coating is uniform, so that the encapsulation materials of the photovoltaic assemblies can meet the technical standards of the photovoltaic industry such as anti-ultraviolet, anti-aging, anti-impact, fire resistance, anti-insulation, etc. The material is lightweight and cost-effective, can replace the toughened glass of traditional packaging structures to provide certain rigidity for photovoltaic assemblies to protect photovoltaic cells. In this way, not only the weight of the photovoltaic assemblies can be greatly reduced, thus facilitating the installation of the photovoltaic products in most occasions, but also the labor intensity and the convenience of installation can be reduced, thus reducing the installation cost of the photovoltaic assemblies on the whole.

Experiments show that when the polyester resin employs a hydroxyl polyester resin or carboxyl polyester resin, the glass transition temperature is controlled at 50-75° C. and the viscosity at 15-200 Pa·s; when a hydroxyl polyester resin is employed, the hydroxyl value of the hydroxyl polyester resin should be 30-300 mgKOH/g; when a carboxyl polyester resin is employed, the acid value of the carboxyl polyester resin should be 15-85 mgKOH/g. This can ensure the performance of the polyester powder coatings in the properties such as anti-ultraviolet, anti-aging, anti-impact, fire resistance, anti-insulation and the like, while the cost of materials is much lower than that of acrylic resin.

The disclosure also provides a method of preparing the laminated structure. The method comprises laminating the first encapsulation layer and the second encapsulation layer at three independent heating stages. The first heating stage ensures that the first powder coating and the second powder coating have enough time to melt, level off, and the bubbles can be fully drained. The second heating stage ensures that the first powder coating and the second powder coating are fully crosslinked and cured. The third heating stage, that is, the pressurized cooling stage, balances the cooling speed and shrinkage of different materials in the laminated structure of the photovoltaic assemblies, to yield a flat structure, thus achieving the lamination process in low temperature environment, reducing the energy consumption, ensuing the smoothness of the laminated structure of the photovoltaic assemblies, and facilitating the installation and application of the photovoltaic assemblies with aesthetic appearance.

The disclosure employs a coating device to evenly distribute the first or second powder coating on the fiber cloth. The coating device can ensure the uniform coating of the first powder coating or the second powder coating on the fiber cloth. The first powder coating or the second powder coating is pre-bonded to the fiber cloth through pressurized heating. The bonded product is sectionally cut to yield the first encapsulation layer and the second encapsulation layer of the photovoltaic assemblies with appropriate sizes, so that the photovoltaic assemblies can meet the installation requirements of different buildings, thus facilitating the installation and application of photovoltaic assemblies.

DETAILED DESCRIPTION

One example of the disclosure provides a laminated structure of a photovoltaic assembly comprising a first encapsulation layer, a second encapsulation layer, and a solar cell string between the first encapsulation layer and the second encapsulation layer. The first encapsulation layer comprises 30-50 wt. % of fiber cloth and 50-70 wt. % of a first powder coating evenly disposed on the fiber cloth; the second encapsulation layer comprises 30-50 wt. % of the fiber cloth and 50-70 wt. % of a second powder coating evenly disposed on the fiber cloth; the first powder coating employs an acrylic powder coating or a polyester powder coating; the second powder coating employs the polyester powder coating; the acrylic powder coating comprises an acrylic resin and an acrylic resin curing agent; and the polyester powder coating comprises a polyester resin and a polyester resin curing agent.

The first encapsulation layer comprises 30-50 wt. % of fiber cloth and 50-70 wt. % of acrylic powder coating or the polyester powder coating evenly disposed on the fiber cloth; the second encapsulation layer comprises 30-50 wt. % of fiber cloth and 50-70 wt. % of the polyester powder coating evenly disposed on the fiber cloth; when the glass transition temperature and viscosity as well as hydroxyl and acid values of the polyester resin are appropriately controlled, the polyester obtained by crosslinking and curing as the encapsulation material of the surface and back layers can meet the requirements of the technical standards of the photovoltaic industry. Because the cost of the polyester powder coating is much lower than that of the acrylic powder coating, the weight ratio of the powder coating and the fiber cloth is appropriate, and the coating is uniform, so that the encapsulation materials of the photovoltaic assemblies can meet the technical standards of the photovoltaic industry such as anti-ultraviolet, anti-aging, anti-impact, fire resistance, anti-insulation, etc. The material is lightweight and cost-effective, can replace the toughened glass of traditional packaging structures to provide certain rigidity for photovoltaic assemblies to protect photovoltaic cells. In this way, not only the weight of the photovoltaic assemblies can be greatly reduced, thus facilitating the installation of the photovoltaic products in most occasions, but also the labor intensity and the convenience of installation can be reduced, thus reducing the installation cost of the photovoltaic assemblies on the whole.

The disclosure also provides a method of preparing the aforesaid laminated structure. The method comprises laminating the first encapsulation layer and the second encapsulation layer at three independent heating stages: a first stage at a temperature of 110-130° C. for 100-600 seconds, a second stage at a temperature of 131-200° C., for 100-1200 seconds, and a third stage at a temperature of 25-60° C. under a pressure of 0.05-0.25 megapascal. The method achieves the lamination process in low temperature environment, reduces the energy consumption, ensures the smoothness of the laminated structure of the photovoltaic assemblies, thus facilitating the installation and application of the photovoltaic assemblies with aesthetic appearance.

The disclosure further provides a photovoltaic assembly comprising the aforesaid laminated structure, a coupler, and a junction box, and the laminated structure is electrically connected to the junction box via the coupler. In the related art, conventional photovoltaic assemblies adopt standard fast electrical connectors, which are expensive. The coupler of the embodiment can make the electrical connection reliable and cheap.

To further illustrate, embodiments detailing a laminated structure of a photovoltaic assembly are described below. It should be noted that the following embodiments are intended to describe and not to limit the disclosure.

Example 1

Figure 2:
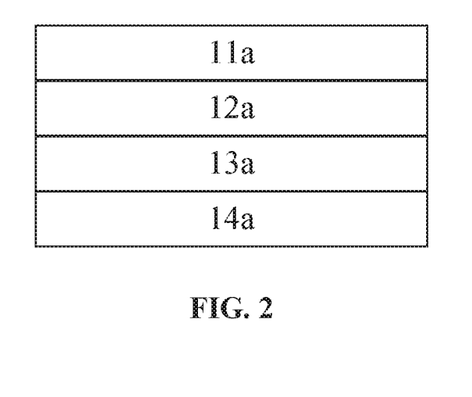
FIG. 2 is a schematic diagram of a laminated structure of a photovoltaic assembly in Example 1 of the disclosure.

As shown in FIG. 2, a laminated structure of a photovoltaic assembly comprises a first encapsulation layer 11a, a second encapsulation layer 14a, and a solar cell string 13a.

The laminated structure further comprises a fluoroplastic film layer, which is disposed on the first encapsulation layer. The laminated structure comprises a packaging film layer. The packaging film layer can be separately disposed between the first encapsulation layer and the solar cell string or between the solar cell string and the second encapsulation layer, or simultaneously disposed between the first encapsulation layer and the solar cell string, and between the solar cell string and the second encapsulation layer. The packaging film layer can be made of EVA, POE or PVB materials. Optionally, technicians in the field can also use other suitable packaging film materials in practice. Preferably, to increase the insulation performance of the photovoltaic assembly and reduce water vapor transmission, the laminated structure comprises a backplane layer, which is disposed below the second encapsulation layer.

Therefore, based on the above descriptions, the technical personnel in the field can choose the laminated structure of photovoltaic assemblies according to actual needs, and optionally, other types of material layers can also be disposed. As long as the core technical characteristics of the disclosure are involved, these belong to the scope of protection of the disclosure. The following embodiments of the disclosure only are intended to illustrate a laminated structure of a photovoltaic assembly.

In this example, as shown in FIG. 2, the laminated structure comprises a packaging film layer 12a. The packaging film layer 12a is disposed between the first encapsulation layer 11a and the solar cell string 13a. Preferably, the packaging film layer 12a is made of EVA.

The first encapsulation layer comprises 30-50 wt. % of fiber cloth and 50-70 wt. % of a first powder coating evenly disposed on the fiber cloth; the second encapsulation layer comprises 30-50 wt. % of the fiber cloth and 50-70 wt. % of a second powder coating evenly disposed on the fiber cloth. Preferably, the first encapsulation layer comprises 35-45 wt. % of fiber cloth and 55-65 wt. % of a first powder coating evenly disposed on the fiber cloth; the second encapsulation layer comprises 35-45 wt. % of the fiber cloth and 55-65 wt. % of a second powder coating evenly disposed on the fiber cloth. More particularly, the first encapsulation layer comprises 30 wt. % of fiber cloth and 70 wt. % of a first powder coating evenly disposed on the fiber cloth; the second encapsulation layer comprises 50 wt. % of the fiber cloth and 50 wt. % of a second powder coating evenly disposed on the fiber cloth.

The fiber cloth is woven from fiber material. Optimally, in the embodiment of the disclosure, the fiber cloth is made of any weaving mode or combination of several weaving modes in plain, twill, satin, rib or mat weaving. Specifically, in the embodiment, the fiber cloth is made of the fiber material in a plain weaving mode, and optionally, the one of ordinary in the field can choose other known weaving methods as needed.

Particularly, the weight per unit area of the fiber cloth is within the range of 30-400 g/m$^2$, which can ensure the fiber cloth is lightweight and has required strength. Specifically, in this embodiment, the weight per unit area of the fiber cloth is 100 g/m$^2$. The weight per unit area of the first powder coating and the second powder coating on the fiber cloth is in the range of 70-400 g/m$^2$. Specifically, in the example, the weight per unit area of the first powder coating on the fiber cloth is 233 g/m$^2$, and the weight per unit area of the second powder coating on the fiber cloth is 100 g/m$^2$.

Specifically, the fiber material is glass fiber, carbon fiber, aramid fiber, or a mixture thereof, which can ensure fiber cloth has good insulation and weatherability. In this example, the fiber material is glass fiber. Optionally, the technicians can choose other types of fiber materials according to actual needs.

The monofilament diameter of the fiber material ranges from 3 to 23 microns. Specifically, in the example, the monofilament diameter of the fiber material is 5 microns, which is convenient for the weaving of the fiber material and for obtaining the fiber cloth with required unit area weight.

The first powder coating is acrylic powder coating or super weathering polyester powder coating. Specifically, in this example, the first powder coating is acrylic powder coating, and the acrylic powder coating includes an acrylic resin and a curing agent of the acrylic resin. Preferably, in this example, the refractive index of the acrylic resin is 1.40-1.50, the epoxy equivalent is 300-800 g/eq, the hydroxyl value is 15-70 mg KOH/g, the acidity value is 15-85 mg KOH/g, the glass transition temperature is 40-70° C., the viscosity is 75-600 Pa·s, and the softening point temperature is 100-120° C., so as to ensure that the acrylic resin has good insulation and weatherability and meets the requirements of photovoltaic standards. Particularly, the acrylic resin is a hydroxyl acrylic resin, a carboxyl acrylic resin, or a mixture thereof. The impact resistance of a hydroxyl acrylic resin is better than that of GMA (glycidyl methacrylate) acrylic resin. The yellowing resistance of a carboxylic acrylic resin is better than that of GMA (glycidyl methacrylate) acrylic resin. As a less preferred solution, GMA (glycidyl methacrylate) acrylic resin or a bifunctional acrylic resin can also be used. Specifically, in this example, the acrylic resin is a hydroxyl acrylic resin. Optionally, technicians in the field can choose other types of acrylic resins according to their actual needs.

Preferably, the acrylic powder coating comprises 5-25 wt. % of the acrylic resin curing agent; the acrylic resin curing agent is blocked isocyanate, phthalic anhydride, trimellitic anhydride, sebacic acid, undecandioic acid, dodecanedioic acid, tridecanedioic acid, tetradecanedioic acid, pentadecanedioic acid, hexadecanedioic acid, carboxyl polyester, hydrogenated epoxy, GMA acrylic acid or a mixture thereof, or a mixture thereof. Specifically, in this example, the acrylic resin curing agent is phthalic anhydride which accounts for 10 wt. % of the acrylic powder coating. Optionally, technicians in the field can select other types of acrylic resin curing agents in the 5-25% weight ratio range (including 5% and 25% end point values) according to the type and actual situation of the acrylic resin, and the same technical effect can be achieved. In this example, 10-20 wt. % of the acrylic resin curing agent is employed to achieve better curing effect.

Particularly, the acrylic powder coating further comprises 5-50 wt. % of a first additive, preferably, 10-40 wt. % of the first additive, and more preferably, 15-25 wt. % of the first additive, for further improving the transparency, weatherability, insulation and flame retardancy of the acrylic powder coating. The first additive is polyamide wax, polyolefin wax, amide-modified phenol-urea surfactants, benzoin, polydimethylsiloxane, vinyl trichlorosilane, n-butyl triethoxysilane, methyl orthosilicate, monoalkoxypyrophosphate, acrylic esters, phenolic resin, urea-formaldehyde resin, melamine-formaldehyde resin, diethylene stearate, ethylene oxide and propylene oxide mixture, hindered phenol, thiodipropionate, benzophenone, salicylate derivatives, hindered amines, alumina, gaseous silica, silica, or a mixture thereof, preferably, polyamide wax, polyolefin wax, amide-modified phenol-urea surfactants, benzoin, polydimethylsiloxane, vinyl trichlorosilane, n-butyl triethoxysilane, methyl orthosilicate, monoalkoxypyrophosphate, acrylic esters, phenolic resin, urea-formaldehyde resin, melamine-formaldehyde resin, diethylene stearate, ethylene oxide and propylene oxide mixture, hindered phenol, thiodipropionate, benzophenone, salicylate derivatives, hindered amines, which can greatly improve the weatherability, insulation and flame retardancy of the acrylic powder coating. In this example, the first additive accounts for 18 wt. % of the acrylic powder coating, and is a mixture of polyamide wax, amide modified phenol urea surfactant, benzoin, alumina and silicon dioxide. Optionally, other type of the first additive can be used as needed. Particularly, according to the actual requirement of the installation of the photovoltaic assembly, the color of the acrylic powder coating can be adjusted by adding pigments and fillers. Specifically, the pigments and fillers can be blue color, red or yellow color, or a mixed color as needed.

The second powder coating comprises a polyester powder coating. The polyester powder coating comprises a polyester resin and a polyester resin curing agent. Preferably, the polyester resin is a hydroxyl polyester resin, a carboxyl polyester resin, or a mixture thereof, to ensure that the polyester resin has good insulation and weatherability and meets the requirements of photovoltaic standards. Specifically, in this example, the polyester resin is hydroxyl polyester resin.

The hydroxyl value of the hydroxyl polyester resin is 30-300 mgKOH/g, the glass transition temperature is 50-75° C. and the viscosity is 15-200 Pa·s. Other parameters result in poor implementation effect and fail to meet the requirements of the photovoltaic standards. Specifically, the hydroxyl value of the hydroxyl polyester resin is 100 mgKOH/g, the glass transition temperature is 60° C. and the viscosity is 80 Pa·s. The hydroxyl polyester resin is formed by monomers such as neopentyl glycol, adipic acid, ethylene glycol, or a mix there thereof. Optionally, other type of monomers can also be used for preparation of the hydroxyl polyester resin. In this example, the hydroxyl polyester resin is formed by adipic acid.

The polyester powder coating comprises 2-20 wt. % of the polyester resin curing agent; the polyester resin curing agent is triglycidyl isocyanurate, triglycidyl tribenzoate, diglycidyl terephthalate, glycidyl methacrylate, hydroxyalkylamide, isocyanate, or a mixture thereof, or a mixture thereof. Preferably, the curing agent is triglycidyl isocyanurate which accounts for 5 wt. % of the polyester powder coating. Optionally, technicians in the field can select other types of polyester resin curing agents in the 2-20% weight ratio range (including 2% and 20% end point values) according to the type and actual situation of the polyester resin, and the same technical effect can be achieved. In this example, 5-15 wt. % of the polyester resin curing agent is employed to achieve better curing effect.

Particularly, the polyester powder coating further comprises 3-40 wt. % of a second additive, for further improving the weatherability and insulation of the polyester powder coating. The color of the polyester powder coating can be adjusted by adding additives according to the actual needs of the installation of the photovoltaic assembly Specifically, the second additive is polyamide wax, polyolefin wax, amide-modified phenol urea surfactant, benzoin, polydimethylsiloxane, vinyl trichlorosilane, n-butyl triethoxysilane, methyl orthosilicate, monoalkoxy pyrophosphate, acrylic ester, phenolic resin, urea formaldehyde resin, melamine formaldehyde resin, distearyl ethylenediamine, ethylene oxide and propylene oxide mixture, hindered phenol, dithiopropionate, benzophenone, salicylate derivatives, hindered amine, alumina, gaseous silica, tetrabromobisphenol A, decabromodiphenylethane, trimethylphenyl phosphate, aluminium hydroxide, magnesium hydroxide, barium sulfate, titanium dioxide, carbon black, or a mixture thereof; preferably, polyamide wax, polyolefin wax, amide-modified phenol urea surfactant, benzoin, polydimethylsiloxane, vinyl trichlorosilane, n-butyl triethoxysilane, methyl orthosilicate, monoalkoxy pyrophosphate, acrylic ester, phenolic resin, urea formaldehyde resin, melamine formaldehyde resin, distearyl ethylenediamine, ethylene oxide and propylene oxide mixture, hindered phenol, dithiopropionate, benzophenone, salicylate derivatives, hindered amine, or a mixture thereof. Optionally, other type of the first additive can be used as needed. Particularly, according to the actual requirement of the installation of the photovoltaic assembly, the color of the polyester powder coating can be adjusted by adding pigments and fillers. Specifically, the pigments and fillers can be blue color, red or yellow color, or a mixed color as needed.

The first powder coating and the second powder coating involved in the embodiment of the disclosure can be prepared by a known preparation technology in the related art. Typical methods comprise pre-mixing, melt extrusion, grinding and so on. Specifically, in this example, the acrylic resin or super-weatherproof hydroxyl polyester resin, a curing agent and an additive are premixed for 2-10 min. The premixed mixture is extruded by a screw extruder and pressed into thin sheets. Preferably, the length-diameter ratio of the extruder is between 15:1 and 50:1, the heating temperature of the extruder is 80-120° C., the screw speed of the extruder is 200-800 rpm. The sheets are pulverized into small pieces which are ground into powder coatings with a certain size in a mill. The rotation speed of the mill is 50-150 rpm. Particularly, the particle size of the first powder coating and the second powder coating is controlled between 35 and 300 microns. These optimized parameters are designed to ensure the particle size uniformity of the powder coatings and provide basic conditions for the uniform distribution of the power coating on the fiber cloth. Other process parameters or powder coating preparation process can also be used to prepare the first powder coating or the second powder coating. This is not described in detail in this disclosure.

The first encapsulation layer or the second encapsulation layer is prepared as follows:

a) evenly disposing the first powder coating or the second powder coating on the fiber cloth;

b) thermally bonding the first powder coating or the second powder coating with the fiber cloth, to yield a bonded product;

c) sectionally cutting the bonded product obtained in b).

In the embodiment of the present disclosure, the thermal bonding process needs to be conducted under a suitable range of pressure and heating, because only under the appropriate pressure and temperature conditions can the first powder coating or the second powder coating achieve a better thermal fusion bonding process with the fiber cloth, and ultimately ensure that the lamination process in the preparation of the photovoltaic assembly is satisfied, to obtain the encapsulation materials suitable for the photovoltaic assemblies. This, in this example, the thermally bonding the first powder coating or the second powder coating with the fiber cloth is performed under a pressure of 0.05-0.25 megapascal at a temperature of 90-130° C. for 5-20 seconds. Specially, the pressure is 0.05 megapascal, the temperature is 130° C., and the heating time is 5 seconds.

Figure 10:
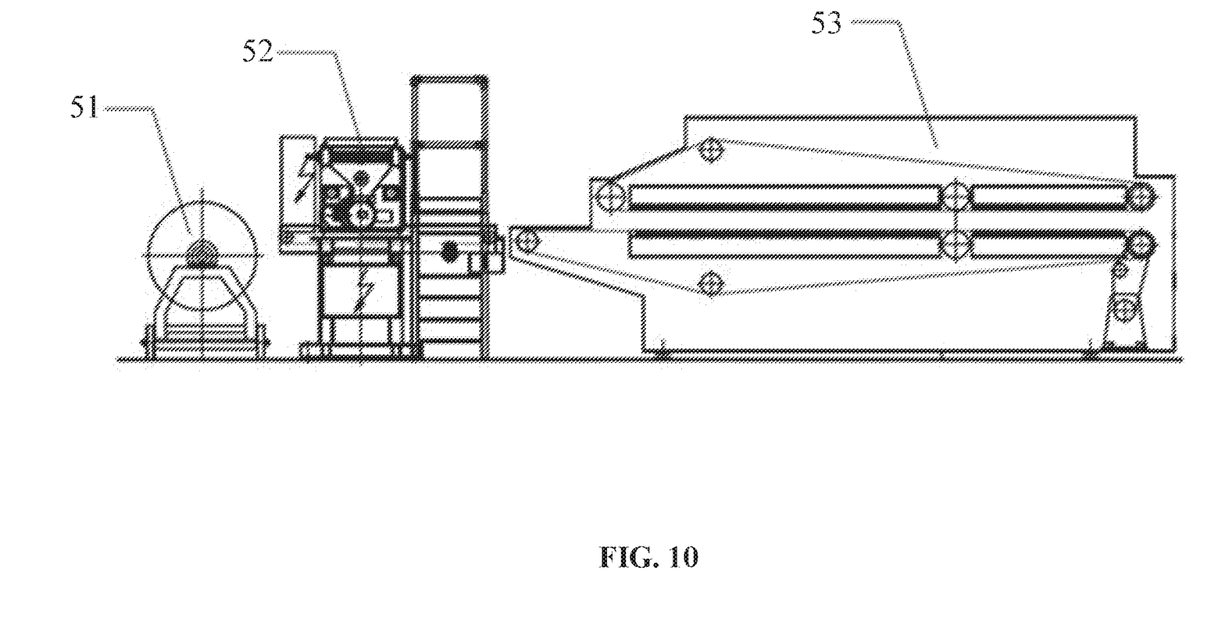
FIG. 10 is a schematic diagram of a preparation device of a first encapsulation layer and a second encapsulation layer of the disclosure.

The first encapsulation layer and the second encapsulation layer are prepared by the device shown in FIG. 10. In the preparation process, the fiber cloth is introduced to a fiber feeder 51. The first powder coating or the second powder coating is evenly distributed by a coating device 52 on the fiber cloth output from the fiber feeder 51. And then the first powder coating or the second powder coating is thermally bonded with the fiber cloth by a hot melt compound machine 53 under appropriate pressure and temperature. The bonded product is sectionally cut to yield an encapsulating material of a photovoltaic assembly. The operation is easy and the coating is uniform. In certain embodiments of the disclosure, the coating device can adopt a powder spreading head. Thus, the coating device can conduct the coating process in the form of powder spreading, so that the first powder coating or the second powder coating can be uniformly distributed on the fiber cloth. Optionally, as needed, the technician can also select any known equipment in the field according to actual needs to prepare the first and second powder coatings, as long as the first powder coating or second powder coating can be evenly distributed on the fiber cloth.

The laminated structure of the photovoltaic assembly is prepared using a lamination process. The lamination process comprises three independent heating stages: a first stage at a temperature of 110-130° C. for 100-600 seconds, a second stage at a temperature of 131-200° C. for 100-1200 seconds, and a third stage at a temperature of 25-60° C. under a pressure of 0.05-0.25 megapascal. Preferably, the first stage is at a temperature of 115-125° C. for 300-500 seconds, the second stage at a temperature of 140-1.80° C. for 400-1000 seconds, and the third stage at a temperature of 40-50° C. under a pressure of 0.1-0.2 megapascal. Particularly, in this example, the first stage is at 120° C. for 400 seconds, the second stage at a temperature of 160° C. for 700 seconds, and the third stage at a temperature of 45° C. under a pressure of 0.15 megapascal.

Also provided is a photovoltaic assembly, comprising the aforesaid laminated structure, a coupler, and a junction box, and the laminated structure being electrically connected to the junction box via the coupler.

Figure 12:
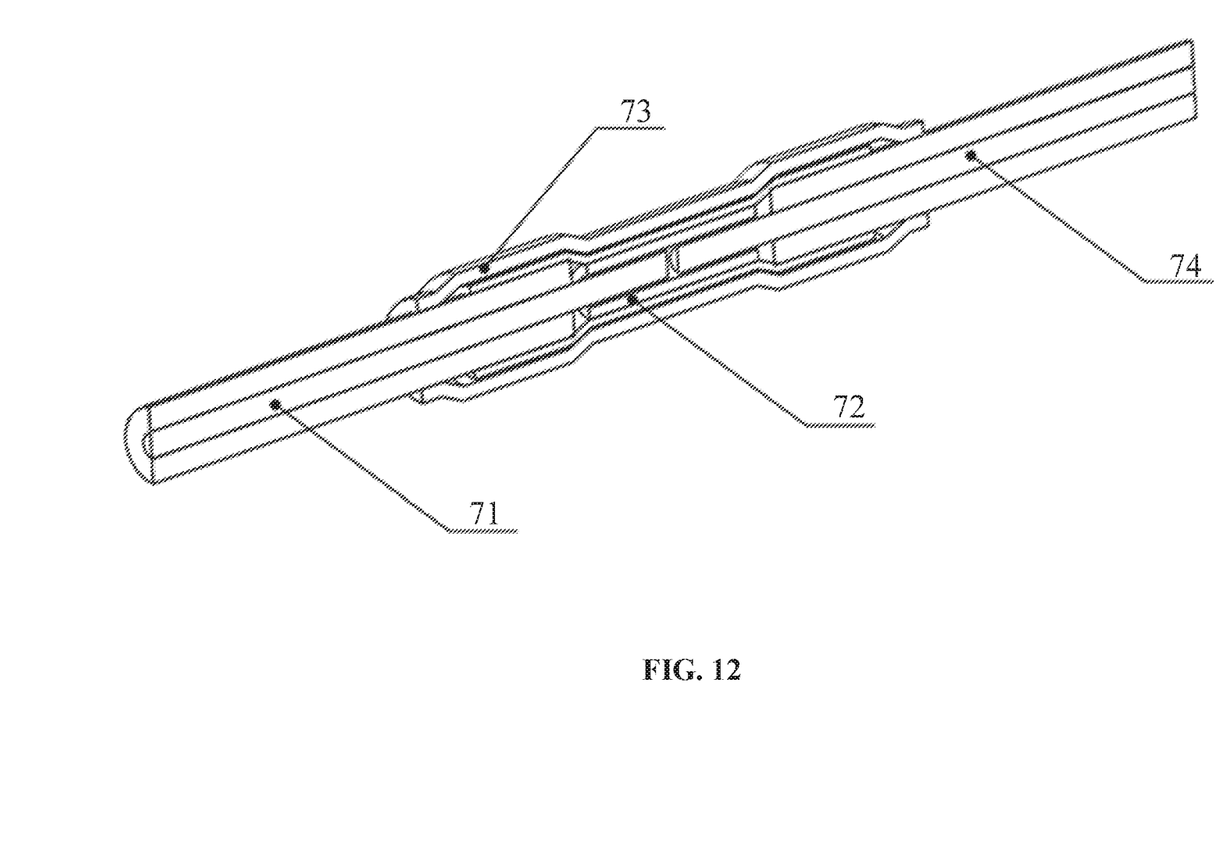
FIG. 12 is a schematic diagram of a coupler as described in the disclosure.

As shown in FIG. 12, the coupler comprises a crimp terminal 72 adapted to receive cables 71, 74, and a heat-shrinkable sleeve 73 which is sheathed on the crimp terminal. The cables 71, 74 are located at two ends of the coupler. The electrical connection of the laminated structure of the photovoltaic assembly is reliable and cost-effective.

Example 2

Figure 3:
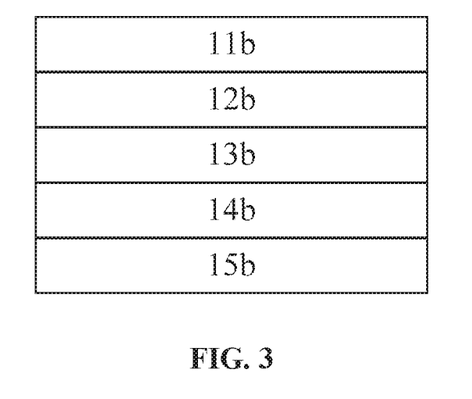
FIG. 3 is a schematic diagram of a laminated structure of a photovoltaic assembly in Example 2 of the disclosure.

As shown in FIG. 3, the laminated structure comprises a fluoroplastic film layer 11b, a first encapsulation layer 12b, a first packaging film layer 13b, a solar cell string 14b, and a second encapsulation layer 15b; the fluoroplastic film layer 11b is disposed above the first encapsulation layer 12b, and the other technical schemes in Example 2 are the same as those in Example 1.

Example 3

Figure 4:
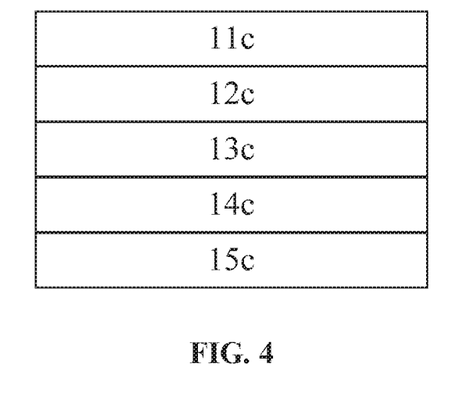
FIG. 4 is a schematic diagram of a laminated structure of a photovoltaic assembly in Example 3 of the disclosure.

As shown in FIG. 4, the laminated structure comprises a first encapsulation layer 11e, a first packaging film layer 12c, a solar cell string 13e, a second encapsulation layer 14c, and a backplane layer 15c; the backplane layer 15c is disposed below the second encapsulation layer 14e, and the other technical schemes in Example 3 are the same as those in Example 1.

Example 4

Figure 5:
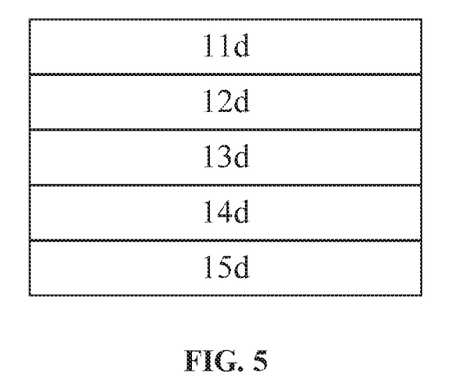
FIG. 5 is a schematic diagram of a laminated structure of a photovoltaic assembly in Example 4 of the disclosure.

As shown in FIG. 5, the laminated structure comprises a first encapsulation layer 11d, a first packaging film layer 12d, a solar cell string 13d, a second packaging film layer 14d, and a second encapsulation layer 15d; the second packaging film layer 14d is disposed between the solar cell string 13d and the second encapsulation layer 15d, and the other technical schemes in Example 4 are the same as those in Example 1.

Example 5

Figure 6:
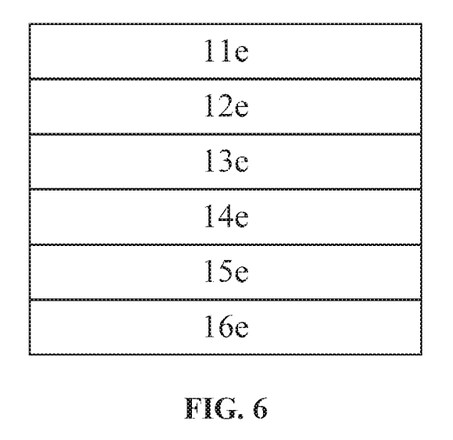
FIG. 6 is a schematic diagram of a laminated structure of a photovoltaic assembly in Example 5 of the disclosure.

As shown in FIG. 6, the laminated structure comprises a fluoroplastic film layer 11e, a first encapsulation layer 12e, a first packaging film layer 13e, a solar cell string 14e, a second packaging film layer 15e, and a second encapsulation layer 16e; the fluoroplastic film layer 11e is disposed on the first encapsulation layer 12e; the second packaging film layer 15e is disposed between the solar cell string 14e and the second encapsulation layer 16e, and the other technical schemes in Example 5 are the same as those in Example 1.

Example 6

Figure 7:
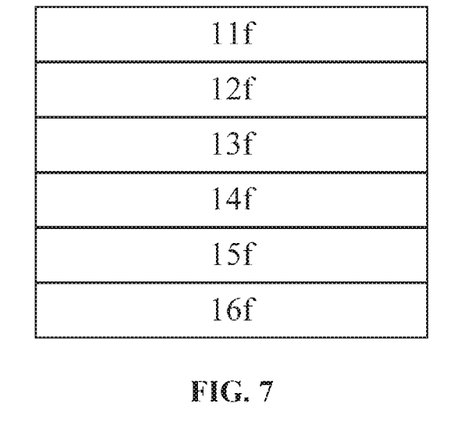
FIG. 7 is a schematic diagram of a laminated structure of a photovoltaic assembly in Example 6 of the disclosure.

As shown in FIG. 7, the laminated structure comprises a first encapsulation layer 11f, a first packaging film layer 12f, a solar cell string 13f, a second packaging film layer 14f, a second encapsulation layer 15f, and a backplane layer 16f; the backplane layer 16f is disposed below the second encapsulation layer 15f; the second packaging film layer 14f is disposed between the solar cell string 13f and the second encapsulation layer 15f, and the other technical schemes in Example 6 are the same as those in Example 1.

Example 7

Figure 8:
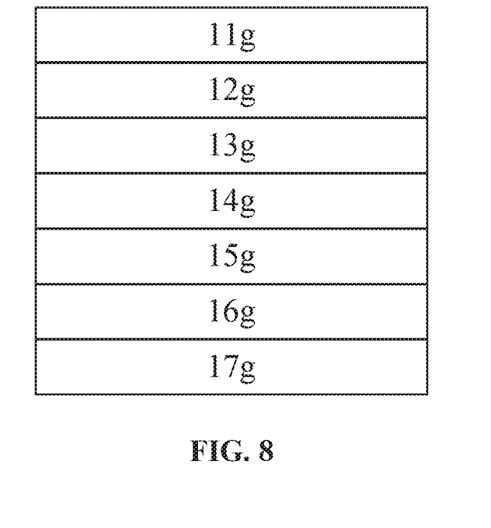
FIG. 8 is a schematic diagram of a laminated structure of a photovoltaic assembly in Example 7 of the disclosure.
Figure 11:
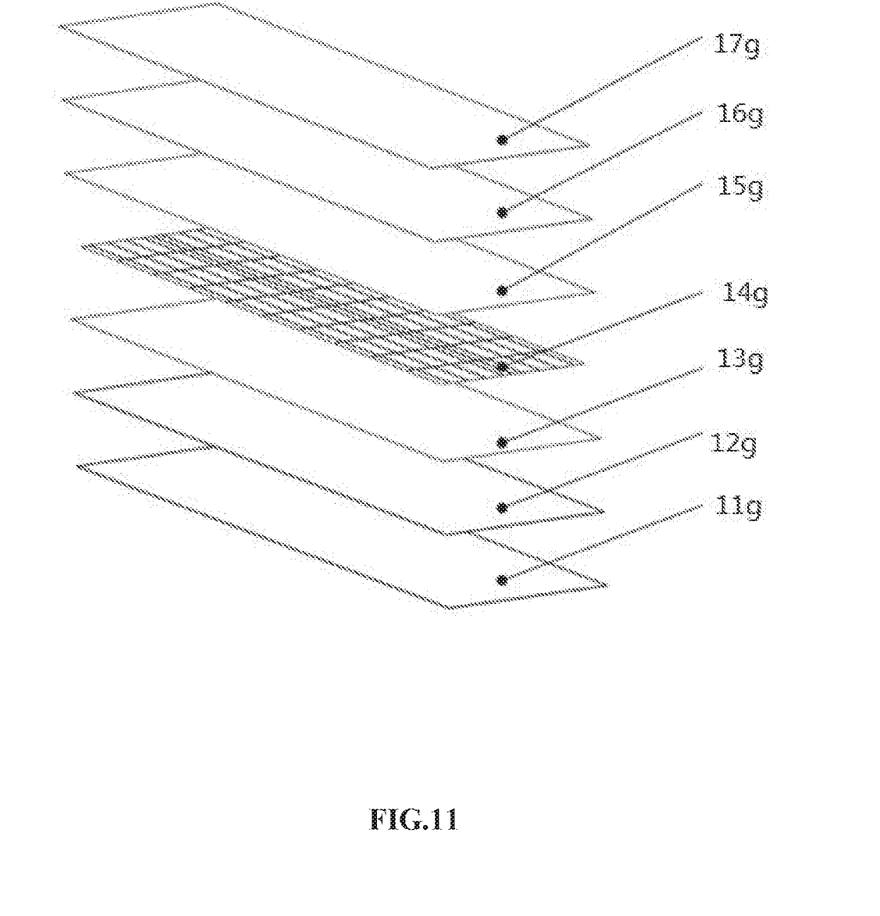
FIG. 11 is a structural arrangement diagram of the laminated structure in FIG. 8.

As shown in FIG. 8 and FIG. 11, the laminated structure comprises a fluoroplastic film layer 11g, a first encapsulation layer 12g, a first packaging film layer 13g, a solar cell string 14g, a second packaging film layer 15g, a second encapsulation layer 16g, and a backplane layer 17g; the fluoroplastic film layer 11g is disposed on the first encapsulation layer 12g; the backplane layer 17g is disposed below the second encapsulation layer 16g; the second packaging film layer 15g is disposed between the solar cell string 14g and the second encapsulation layer 16g, and the other technical schemes in Example 7 are the same as those in Example 1.

Example 8

Figure 9:
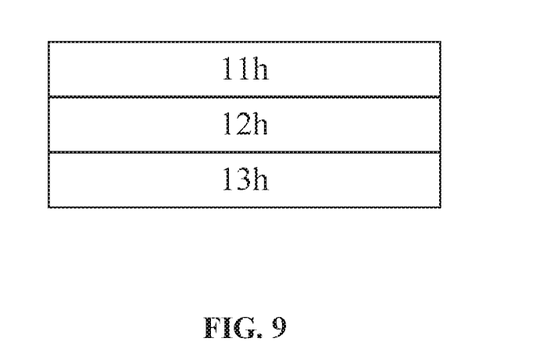
FIG. 9 is a schematic diagram of a laminated structure of a photovoltaic assembly in Example 8 of the disclosure.

As shown in FIG. 9, the laminated structure comprises a first encapsulation layer 11h, a solar cell string 12h, and a second encapsulation layer 13h; the solar cell string 12h is disposed between the first encapsulation layer 11h and the second encapsulation layer 13h, and the other technical schemes in Example 8 are the same as those in Example 1.

Example 9

In this example, the first powder coating and the second power coating both employ a polyester powder coating. In the lamination process, the first stage was performed at 125° C. for 350 seconds, the second stage at 165° C. for 750 seconds, and the third stage at 48° C. under the pressure of 0.13 megapascal. The other technical schemes in Example 9 are the same as those in any of Examples 1-8.

Example 10

In this example, the first encapsulation layer comprises 35 wt. % of fiber cloth and 65 wt. % of an acrylic powder coating evenly disposed on the fiber cloth. The second encapsulation layer comprises 30 wt. % of fiber cloth and 70 wt. % of a polyester powder coating evenly disposed on the fiber cloth. The acrylic resin employs a carboxyl acrylic resin. The polyester resin is a carboxyl polyester resin, which is a mixed polymer formed by monomers terephthalic acid, isophthalic acid, or a mixture thereof. The carboxyl polyester resin has an acid value of 15-85 mgKOH/g, a glass transition temperature of 50-75° C. and a viscosity of 15-200 Pa·s. Specifically, in this example, the carboxyl polyester resin is formed by monomers terephthalic acid. The carboxyl polyester resin has an acid value of 85 mgKOH/g, a glass transition temperature of 75° C. and a viscosity of 200 Pa·s. The curing agent used in this example is triglycidyl tribenzoate which accounts for 8 wt. % of the polyester powder coating.

In the lamination process, the first stage was performed at 115° C. for 500 seconds, the second stage at 180° C. for 400 seconds, and the third stage at 50° C. under the pressure of 0.2 megapascal.

The other technical schemes in Example 10 are the same as those in any of Examples 1-8.

Example 11

In this example, the first encapsulation layer comprises 40 wt. % of fiber cloth and 60 wt. % of an acrylic powder coating evenly disposed on the fiber cloth. The second encapsulation layer comprises 35 wt. % of fiber cloth and 65 wt. % of a polyester powder coating evenly disposed on the fiber cloth. The acrylic resin employs a GMA acrylic resin, and the curing agent is blocked isocyanate which accounts for 10 wt. % of the acrylic powder coating.

In the lamination process, the first stage was performed at 120° C. for 400 seconds, the second stage at 160° C. for 700 seconds, and the third stage at 45° C. under the pressure of 0.15 megapascal.

The other technical schemes in Example 11 are the same as those in any of Examples 1-8.

Example 12

In this example, the first encapsulation layer comprises 45 wt. % of fiber cloth and 55 wt. % of a polyester powder coating evenly disposed on the fiber cloth. The second encapsulation layer comprises 40 wt. % of fiber cloth and 60 wt. % of a polyester powder coating evenly disposed on the fiber cloth. The polyester resin employs a carboxyl polyester resin which is synthesized from the monomer of isophthalic acid, and has an acid value of 60 mg KOH/g, a glass transition temperature of 60° C. and a viscosity of 100 Pa·s.

In the lamination process, the first stage was performed at 110° C. for 600 seconds, the second stage at 180° C. for 300 seconds, and the third stage at 60° C. under the pressure of 0.06 megapascal.

The other technical schemes in Example 12 are the same as those in any of Examples 1-8.

Example 13

In this example, the first encapsulation layer comprises 50 wt. % of fiber cloth and 50 wt. % of a first powder coating evenly disposed on the fiber cloth. The second encapsulation layer comprises 45 wt. % of fiber cloth and 55 wt. % of a second powder coating evenly disposed on the fiber cloth. The first powder coating employs a hydroxyl polyester resin which is synthesized by monomers of neopentyl glycol and has an acid value of 180 mg KOH/g, a glass transition temperature of 70° C. and a viscosity of 120 Pa·s. The first powder coating further comprises 16 wt. % of an additive, which is a mixture of polyolefin wax and methyl orthosilicate. The second powder coating employs a carboxyl polyester resin which is synthesized by monomers of terephthalic acid and has an acid value of 50 mg KOH/g, a glass transition temperature of 55° C. and a viscosity of 80 Pa·s. The second powder coating further comprises 13 wt. % of an additive, which is a mixture of polyolefin wax, an amide-modified phenol-urea surfactant and hindered phenol.

In the lamination process, the first stage was performed at 125° C. for 200 seconds, the second stage at 190° C. for 150 seconds, and the third stage at 60° C. under the pressure of 0.05 megapascal.

The other technical schemes in Example 13 are the same as those in any of Examples 1-7.

Example 14

In this example, the first encapsulation layer comprises 35 wt. % of fiber cloth and 65 wt. % of a first powder coating evenly disposed on the fiber cloth. The second encapsulation layer comprises 35 wt. % of fiber cloth and 65 wt. % of a second powder coating evenly disposed on the fiber cloth. The first powder coating and the second power coatings both employ a hydroxyl polyester resin.

In the lamination process, the first stage was performed at 120° C. for 400 seconds, the second stage at 160° C. for 700 seconds, and the third stage at 45° C. under the pressure of 0.15 megapascal.

The other technical schemes in Example 14 are the same as those in any of Examples 1-8.

Example 15

In this example, the first encapsulation layer comprises 40 wt. % of fiber cloth and 60 wt. % of a first powder coating evenly disposed on the fiber cloth. The second encapsulation layer comprises 40 wt. % of fiber cloth and 60 wt. % of a second powder coating evenly disposed on the fiber cloth. The first powder coating and the second power coatings both employ a carboxyl polyester resin.

In the lamination process, the first stage was performed at 112° C. for 180 seconds, the second stage at 131° C. for 1200 seconds, and the third stage at 25° C. under the pressure of 0.25 megapascal.

The other technical schemes in Example 15 are t same as those in any of Examples 1-8.

Example 16

In this example, in the lamination process, the first stage was performed at 125° C. for 600 seconds, the second stage at 155° C. for 600 seconds, and the third stage at 40° C. under the pressure of 0.18 megapascal.

The other technical schemes in Example 16 are the same as those in any of Examples 1-9.

Comparison Example 1

The encapsulation material refers to that disclosed in Background.

Comparison Example 2

The technical solutions in this example are basically the same at that in Example 7 except that the first and second encapsulation layers of the example comprise 35 wt. % of fiber cloth and 65 wt. % of commercial epoxy powder coating.

Comparison Example 3

The technical solutions in this example are basically the same at that in Example 7 except that the encapsulation material of the example comprise 25 wt. % of fiber cloth and 75 wt. % of powder coatings.

Comparison Example 4

The technical solutions in this example are basically the same at that in Example 7 except that the encapsulation material of the example comprise 55 wt. % of fiber cloth and 45 wt. % of powder coatings.

Comparison Example 5

Refer to the most preferably example in Chinese Patent Publication No. CN105637653A, and the preferable lamination process is also adopted.

Comparison Example 6

The technical solutions in this example are basically the same at that in Example 7 except that the preferable lamination process disclosed in Chinese Patent Publication No. CN105637653A is adopted.

Table 1 and Table 2 list the implementing effectiveness of the laminated structures of the photovoltaic assemblies of the aforesaid examples.

TABLE 1

Comparison of performance parameters of laminated structures in Examples

| Test items | Weight of packaging structure | Impact resistance — Appearance | Impact resistance — Maximum power attenuation | Insulation resistance | Fire resistance |
|---|---|---|---|---|---|
| Examples 1-16 | ≤1 kg/m², easy to install | No serious defects | ≤5% | ≥40 MΩ·m² | Self-extinguishing, non-combustion |
| Comparison Example 1 | ≥8 kg/m², difficult to install | No serious defects | ≤5% | ≥40 MΩ·m² | Self-extinguishing, non-combustion |
| Comparison Example 2 | ≤1 kg/m², easy to install | No serious defects | ≤5% | ≥40 MΩ·m² | Self-extinguishing, non-combustion |
| Comparison Example 3 | ≤1 kg/m², easy to install | No serious defects | ≤5% | ≥40 MΩ·m² | Self-extinguishing, non-combustion |
| Comparison Example 4 | ≤1 kg/m², easy to install | No serious defects | ≤5% | ≥40 MΩ·m² | Self-extinguishing, non-combustion |
| Comparison Example 5 | ≤1 kg/m², easy to install | No serious defects | ≤5% | ≥40 MΩ·m² | Self-extinguishing, non-combustion |
| Comparison Example 6 | ≤1 kg/m², easy to install | No serious defects | ≤5% | ≥40 MΩ·m² | Self-extinguishing, non-combustion |

| Test items | Pencil-hardness | Tensile strength | Elongation at break | Weatherability test |
|---|---|---|---|---|
| Examples 1-16 | No less than 1H | 25-35 Mpa | 150-250% | Passed |
| Comparison Example 1 | No less than 1H | 42 Mpa | 2-3% | Passed |
| Comparison Example 2 | No less than 1H | 80-90 Mpa | 50-70% | Failed |
| Comparison Example 3 | No less than 1H | ≤10 Mpa | ≤100% | Passed |
| Comparison Example 4 | No less than 1H | 25-35 Mpa | 150-250% | Failed |
| Comparison Example 5 | No less than 1H | 80-90 Mpa | 50-70% | Passed |
| Comparison Example 6 | No less than 1H | 25-35 Mpa | 150-250% | Passed |

TABLE 2

Comparison of production costs and preparation processes s of laminated structures in Examples

| Test items | Scratch resistance | Costs | Lamination process | Flatness | Color of laminated structure |
|---|---|---|---|---|---|
| Examples 1-16 | Yes | Low or very low | Plain process, low lamination temperature, and low energy consumption | Yes | The color can be adjusted and changed by additives |
| Comparison Example 1 | Yes | Very low | High lamination temperature | Yes | Single color |
| Comparison Example 2 | Yes | Low | Pain process, low lamination temperature, and low energy consumption | Yes | The color can be adjusted and changed by additives |
| Comparison Example 3 | Yes | High | Plain process, low lamination temperature, and low energy consumption | Yes | The color can be adjusted and changed by additives |
| Comparison Example 4 | No | low | Plain process, low lamination temperature, and low energy consumption | Yes | The color can be adjusted and changed by additives |
| Comparison Example 5 | No | Very high | Complex process, high lamination temperature, and high energy consumption | No | Single color |
| Comparison Example 6 | Yes | Low | Complex process, high lamination temperature, and high energy consumption | No | The color can be adjusted and changed by additives |

The weight of the packaging structure described in the disclosure refers to the weight of the encapsulation material for photovoltaic assemblies per square meter. The impact resistance test refers to launching a standard ice hockey ball with a diameter of 25 mm and a mass of 7.53 g at a speed of 23.0 m/s, impacting 11 positions of the encapsulated photovoltaic assembly, and judging the impact resistance of the photovoltaic assembly from three aspects: appearance, maximum power attenuation and insulation resistance. The fire resistance is measured according to UL1703 standard; the pencil-hardness is measured according to ASTM D3363-2005 (R2011); the tensile strength is measured according to GB/T 1040.3-2006 standard; and the elongation at break is measured according to GB/T 1040.3-2006 standard.

As shown in Table 1, the encapsulation materials of the photovoltaic assemblies can meet the technical standards of the photovoltaic industry such as anti-ultraviolet, anti-aging, anti-impact, fire resistance, anti-insulation, etc. The material is lightweight and cost-effective, can replace the toughened glass of traditional packaging structures to provide certain rigidity for photovoltaic assemblies to protect photovoltaic cells. In this way, not only the weight of the photovoltaic assemblies can be greatly reduced, thus facilitating the installation of the photovoltaic products in most occasions, but also the labor intensity and the convenience of installation can be reduced, thus reducing the installation cost of the photovoltaic assemblies on the whole.

As shown in Table 2, the disclosure has the advantages of low cost, excellent scratch resistance, and can implement the lamination process in the low temperature environment, thus reducing the energy consumption, ensuring the flatness of the laminated structure of the photovoltaic assembly, facilitating the installation and application of the photovoltaic assembly under the consideration of the appearance. Table 2 also indicates that, when the first powder coating adopts a polyester powder coating, the cost is lower than that of the acrylic powder coating, and the scratch resistance is better than that of the acrylic powder coating.

The disclosure employs a coating device to evenly distribute the first or second powder coating on the fiber cloth. The coating device can ensure the uniform coating of the first powder coating or the second powder coating on the fiber cloth. The first powder coating or the second powder coating is pre-bonded to the fiber cloth through pressurized heating. The bonded product is sectionally cut to yield the first encapsulation layer and the second encapsulation layer of the photovoltaic assemblies with appropriate sizes, so that photovoltaic assemblies can arbitrarily meet the installation requirements of different buildings, thus facilitating the installation and application of photovoltaic assemblies.

It will be obvious to those skilled in the art that changes and modifications may be made, and therefore, the aim in the appended claims is to cover all such changes and modifications.

What is claimed is:

1. A laminated structure, comprising:
a first encapsulation layer, a second encapsulation layer, and a solar cell string between the first encapsulation layer and the second encapsulation layer;
wherein:
the first encapsulation layer comprises 30-50 wt. % of fiber cloth and 50-70 wt. % of a first powder coating evenly disposed on the fiber cloth;
the second encapsulation layer comprises 30-50 wt. % of the fiber cloth and 50-70 wt. % of a second powder coating evenly disposed on the fiber cloth;
the first powder coating employs an acrylic powder coating or a polyester powder coating;
the second powder coating employs the polyester powder coating;
the acrylic powder coating comprises an acrylic resin and an acrylic resin curing agent;
the polyester powder coating comprises a polyester resin and a polyester resin curing agent; and
the fiber cloth comprises woven fiber material.

2. The structure of claim 1, wherein the laminated structure further comprises a fluoroplastic film layer which is disposed on the first encapsulation layer.

3. The structure of claim 1, wherein the first powder coating and the second powder coating comprises particles that have a size of between 35 and 300 μm and are prepared by premixing, melting, extruding, and milling; a premixing time is 2-10 min; in the extruding process, a length-diameter ratio of an extruder is between 15:1 and 50:1, a heating temperature of the extruder is 80-120° C., a screw speed of the extruder is 200-800 rpm; and a rotation speed of a mill is 50-150 rpm.

4. The structure of claim 2, wherein the first powder coating and the second powder coating comprises particles that have a size of between 35 and 300 μm and are prepared by premixing, melting, extruding, and milling; a premixing time is 2-10 min; in the extruding process, a length-diameter ratio of an extruder is between 15:1 and 50:1, a heating temperature of the extruder is 80-120° C., a screw speed of the extruder is 200-800 rpm; and a rotation speed of a mill is 50-150 rpm.

5. The structure of claim 1, wherein the acrylic powder coating comprises 5-25 wt. % of the acrylic resin curing agent; the acrylic resin curing agent is blocked isocyanate, phthalic anhydride, trimellitic anhydride, sebacic acid, undecandioic acid, dodecanedioic acid, tridecanedioic acid, tetradecanedioic acid, pentadecanedioic acid, hexadecanedioic acid, carboxyl polyester, hydrogenated epoxy, GMA acrylic acid or a mixture thereof.

6. The structure of claim 2, wherein the acrylic powder coating comprises 5-25 wt. % of the acrylic resin curing agent; the acrylic resin curing agent is blocked isocyanate, phthalic anhydride, trimellitic anhydride, sebacic acid, undecandioic acid, dodecanedioic acid, tridecanedioic acid, tetradecanedioic acid, pentadecanedioic acid, hexadecanedioic acid, carboxyl polyester, hydrogenated epoxy, GMA acrylic acid or a mixture thereof.

7. The structure of claim 1, wherein the acrylic powder coating further comprises 5-50 wt, % of a first additive; the first additive is polyamide wax, polyolefin wax, amide-modified phenol-urea surfactants, benzoin, polydimethylsiloxane, vinyl trichlorosilane, n-butyl triethoxysilane, methyl orthosilicate, monoalkoxypyrophosphate, acrylic esters, phenolic resin, urea-formaldehyde resin, melamine-formaldehyde resin, diethylene stearate, ethylene oxide and propylene oxide mixture, hindered phenol, thiodipropionate, benzophenone, salicylate derivatives, hindered amines, alumina, gaseous silica, silica, or a mixture thereof.

8. The structure of claim 2, wherein the acrylic powder coating further comprises 5-50 wt. % of a first additive; the first additive is polyamide wax, polyolefin wax, amide-modified phenol-urea surfactants, benzoin, polydimethylsiloxane, vinyl trichlorosilane, n-butyl triethoxysilane, methyl orthosilicate, monoalkoxypyrophosphate, acrylic esters, phenolic resin, urea-formaldehyde resin, melamine-formaldehyde resin, diethylene stearate, ethylene oxide and propylene oxide mixture, hindered phenol, thiodipropionate, benzophenone, salicylate derivatives, hindered amines, alumina, gaseous silica, silica, or a mixture thereof.

9. The structure of claim 1, wherein the polyester powder coating comprises 2-20 wt. % of the polyester resin curing agent; the polyester resin curing agent is triglycidyl isocyanurate, triglycidyl tribenzoate, diglycidyl terephthalate, glycidyl methacrylate, hydroxyalkylamide, isocyanate, or a mixture thereof.

10. The structure of claim 2, wherein the polyester powder coating comprises 2-20 wt. % of the polyester resin curing agent; the polyester resin curing agent is triglycidyl isocyanurate, triglycidyl tribenzoate, diglycidyl terephthalate, glycidyl methacrylate, hydroxyalkylamide, isocyanate, or a mixture thereof.

11. The structure of claim 1, wherein the polyester resin is a hydroxyl polyester resin or carboxyl polyester resin having a glass transition temperature of 50-75° C. and a viscosity of 15-200 Pa·s; a hydroxyl value of the hydroxyl polyester resin is 30-300 mgKOH/g, and an acid value of the carboxyl polyester resin is 15-85 mgKOH/g.

12. The structure of claim 2, wherein the polyester resin is a hydroxyl polyester resin or carboxyl polyester resin having a glass transition temperature of 50-75° C. and a viscosity of 15-200 Pa·s; a hydroxyl value of the hydroxyl polyester resin is 30-300 mgKOH/g, and an acid value of the carboxyl polyester resin is 15-85 mgKOH/g.

13. The structure of claim 1, wherein the polyester powder coating further comprises 3-40 wt. % of a second additive; the second additive is polyamide wax, polyolefin wax, amide-modified phenol urea surfactant, benzoin, polydimethylsiloxane, vinyl trichlorosilane, n-butyl triethoxysilane, methyl orthosilicate, monoalkoxy pyrophosphate, acrylic ester, phenolic resin, urea formaldehyde resin, melamine formaldehyde resin, distearyl ethylenediamine, ethylene oxide and propylene oxide mixture, hindered phenol, dithiopropionate, benzophenone, salicylate derivatives, hindered amine, alumina, gaseous silica, tetrabromobisphenol A, decabromodiphenylethane, trimethylphenyl phosphate, aluminium hydroxide, magnesium hydroxide, barium sulfate, titanium dioxide, carbon black, or a mixture thereof.

14. The structure of claim 2, wherein the polyester powder coating further comprises 3-40 wt. % of a second additive; the second additive is polyamide wax, polyolefin wax, amide-modified phenol urea surfactant, benzoin, polydimethylsiloxane, vinyl trichlorosilane, n-butyl triethoxysilane, methyl orthosilicate, monoalkoxy pyrophosphate, acrylic ester, phenolic resin, urea formaldehyde resin, melamine formaldehyde resin, distearyl ethylenediamine, ethylene oxide and propylene oxide mixture, hindered phenol, dithiopropionate, benzophenone, salicylate derivatives, hindered amine, alumina, gaseous silica, tetrabromobisphenol A, decabromodiphenylethane, trimethylphenyl phosphate, aluminium hydroxide, magnesium hydroxide, barium sulfate, titanium dioxide, carbon black, or a mixture thereof.

15. The structure of claim 1, wherein the first encapsulation layer or the second encapsulation layer is prepared as follows:
a) evenly disposing the first powder coating or the second powder coating on the fiber cloth;
b) thermally bonding the first powder coating or the second powder coating with the fiber cloth, to yield a bonded product; and
c) sectionally cutting the bonded product obtained in b) to yield the first encapsulation layer or the second encapsulation layer;
wherein:
thermally bonding the first powder coating or the second powder coating with the fiber cloth is performed under a pressure of 0.05-0.25 megapascal at a temperature of 90-130° C. for 5-2.0 seconds.

16. A method of preparing the laminated structure of claim 1, the method comprising laminating the first encapsulation layer and the second encapsulation layer at three independent heating stages: a first stage at a temperature of 110-130° C. for 100-600 seconds, a second stage at a temperature of 131-200° C. for 100-1200 seconds, and a third stage at a temperature of 25-60° C. under a pressure of 0.05-0.25 megapascal.

17. The method of claim 16, further laminating a fluoroplastic film layer on the first encapsulation layer.

18. The method of claim 16, wherein the first powder coating and the second powder coating comprises particles that have a size of between 35 and 300 μm and are prepared by premixing, melting, extruding, and milling; a premixing time is 2-10 min; in the extruding process, a length-diameter ratio of an extruder is between 15:1 and 50:1, a heating temperature of the extruder is 80-120° C., a screw speed of the extruder is 200-800 rpm; and a rotation speed of a mill is 50-150 rpm.

19. A photovoltaic assembly, comprising the laminated structure of claim 1, a coupler, and a junction box, and the laminated structure being electrically connected to the junction box via the coupler.

20. The photovoltaic assembly of claim 19, wherein the coupler comprises a crimp terminal adapted to receive cables, and a heat-shrinkable sleeve which is sheathed on the crimp terminal.

* * * * *